(12) United States Patent
Ishizaka

(10) Patent No.: US 8,520,710 B2
(45) Date of Patent: Aug. 27, 2013

(54) OPTICAL TRANSMISSION MODULE AND CONTROLLING METHOD FOR OPTICAL TRANSMISSION MODULE

(75) Inventor: Tetsuo Ishizaka, Kawasaki (JP)

(73) Assignee: Fujitsu Optical Components Limited, Kawasaki (JP)

( * ) Notice: Subject to any disclaimer, the term of this patent is extended or adjusted under 35 U.S.C. 154(b) by 203 days.

(21) Appl. No.: 13/076,620

(22) Filed: Mar. 31, 2011

(65) Prior Publication Data

US 2012/0020381 A1 Jan. 26, 2012

(30) Foreign Application Priority Data

Jul. 21, 2010 (JP) ................................ 2010-163916

(51) Int. Cl.
*H01S 5/068* (2006.01)
*H01S 5/0683* (2006.01)

(52) U.S. Cl.
USPC ..................... 372/38.01; 372/38.07

(58) Field of Classification Search
USPC ................. 372/38.01, 38.02, 38.07
See application file for complete search history.

(56) References Cited

U.S. PATENT DOCUMENTS

| | | | |
|---|---|---|---|
| 6,292,497 B1 * | 9/2001 | Nakano | 372/29.015 |
| 7,483,455 B2 * | 1/2009 | Hattori | 372/29.02 |
| 2006/0291511 A1 | 12/2006 | Lan et al. | |

FOREIGN PATENT DOCUMENTS

| | | |
|---|---|---|
| JP | 2002-246687 | 8/2002 |
| JP | 2007-5753 | 1/2007 |

* cited by examiner

*Primary Examiner* — Jessica Stultz
*Assistant Examiner* — Michael Carter
(74) *Attorney, Agent, or Firm* — Fujitsu Patent Center

(57) ABSTRACT

An optical transmission module includes a bias current driver circuit adapted to input bias current set in response to a temperature of a laser diode to the laser diode, a modulation current driver circuit adapted to input modulation current set in response to the temperature of the laser diode to the laser diode, and a decision circuit adapted to decide whether or not an error of optical output power of the laser diode detected by a light reception device with respect to a target value of the optical output power of the laser diode at the set bias current and the set modulation current is equal to or higher than a threshold value. The modulation current driver circuit inputs, while the error is equal to or higher than the threshold value, correction modulation current higher than the set modulation current to the laser diode.

6 Claims, 9 Drawing Sheets

FIG. 4

|  | Ip(s) | Ib(s) | Im(s) |
|---|---|---|---|
| 0°C | Ip(s)0°C | Ib(s)0°C | Im(s)0°C |
| 1°C | Ip(s)1°C | Ib(s)1°C | Im(s)1°C |
| ⋮ | ⋮ | ⋮ | ⋮ |
| 74°C | Ip(s)74°C | Ib(s)74°C | Im(s)74°C |
| 75°C | Ip(s)75°C | Ib(s)75°C | Im(s)75°C |

FIG. 7

| Ip(s) | Ib(s) | Im(s) | Ith(s) |
|---|---|---|---|
| Ip(s)0°C | Ib(s)0°C | Im(s)0°C | Ith(s)0°C |
| Ip(s)1°C | Ib(s)1°C | Im(s)1°C | Ith(s)1°C |
| ⋮ | ⋮ | ⋮ | ⋮ |
| Ip(s)74°C | Ib(s)74°C | Im(s)74°C | Ith(s)74°C |
| Ip(s)75°C | Ib(s)75°C | Im(s)75°C | Ith(s)75°C |

0°C
1°C
74°C
75°C

OPTICAL TRANSMISSION MODULE AND CONTROLLING METHOD FOR OPTICAL TRANSMISSION MODULE

CROSS-REFERENCE TO RELATED APPLICATIONS

This application is based upon and claims the benefit of priority of the prior Japanese Patent Application No. 2010-163916, filed on Jul. 21, 2010, the entire contents of which are incorporated herein by reference.

FIELD

The present invention relates to an optical transmission module and a controlling method for an optical transmission module.

BACKGROUND

Since the optical output power and the extinction ratio of a laser diode vary depending upon the temperature, some control is required for the temperature variation in order to implement desired optical output power and extinction ratio. Normally, a laser diode emits modulation light by receiving bias current and modulation current input thereto through a laser driver circuit. The optical output power and the extinction ratio of the laser diode are determined depending upon the bias current and the modulation current. Accordingly, in order to fixedly maintain the optical output power and the extinction ratio, the optical output power is feedback controlled and the modulation current is controlled to a predetermined value. Such control as just described is known APC (Auto Power Control) control.

In Patent Document 1, modulation current to be input to a laser diode is varied in response to a temperature characteristic of the laser diode. Consequently, temperature compensation is carried out under a low-temperature environment or a high-temperature environment.

[Patent Document 1] Japanese Patent Laid-Open No. 2002-246687

SUMMARY

According to an aspect of the invention, there is provided an optical transmission module including a bias current driver circuit adapted to input bias current set in response to a temperature of a laser diode to the laser diode, a modulation current driver circuit adapted to input modulation current set in response to the temperature of the laser diode to the laser diode, and a decision circuit adapted to decide whether or not an error of optical output power of the laser diode detected by a light reception device with respect to a target value of the optical output power of the laser diode at the set bias current and the set modulation current is equal to or higher than a threshold value, wherein the modulation current driver circuit inputs, while the error is equal to or higher than the threshold value, correction modulation current higher than the set modulation current to the laser diode.

According to another aspect of the invention, there is provided a controlling method for an optical transmission module, including inputting bias current set in response to a temperature of a laser diode to the laser diode, inputting modulation current set in response to the temperature of the laser diode to the laser diode, deciding whether or not an error of optical output power of the laser diode detected by a light reception device with respect to a target value of the optical output power of the laser diode at the set bias current and the set modulation current is equal to or higher than a threshold value, and inputting, while the error is equal to or higher than the threshold value, correction modulation current higher than the set modulation current to the laser diode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a view illustrating an example of attached data tables stored in data memories;

FIG. 7 is a view illustrating an example of attached data tables stored in data memories;

DESCRIPTION OF EMBODIMENTS

As described above, in order to fixedly maintain optical output power and an extinction ratio, the optical output power is feedback controlled and the modulation current is controlled to a predetermined value.

However, in a high-temperature range, a laser diode sometimes has a non-linear characteristic between driving current and optical output power. In this instance, even if APC control is carried out, it is sometimes impossible to distinguish whether the bias current varies and the modulation current varies. Accordingly, an error from a desired value sometimes appears regarding the optical output power or the extinction ratio.

In the following, embodiments of the present invention are described with reference to the drawings.

Figure 1:
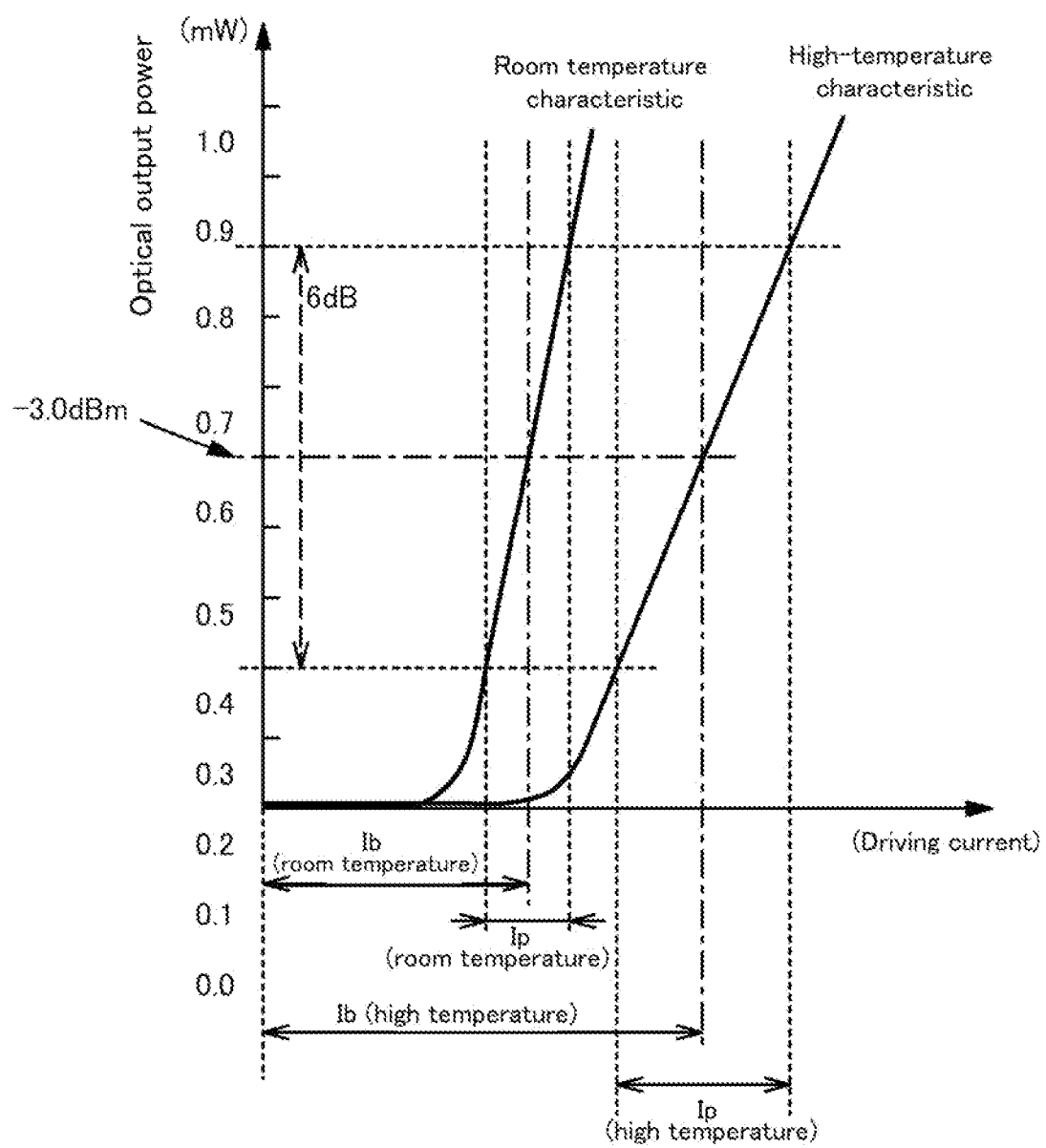
FIGS. 1 and 2 are views illustrating different temperature characteristics of laser diodes.

First, a temperature characteristic of a laser diode is described. FIG. 1 is a view illustrating a temperature characteristic of a laser diode. Referring to FIG. 1, the axis of abscissa indicates driving current input to the laser diode and the axis of ordinate indicates output light power (mW) of the laser diode. Referring to FIG. 1, in the case where the driving current is equal to or lower than a predetermined value, the laser diode does not output light. If the driving current exceeds the predetermined value (oscillation threshold value Ith), then the laser diode starts outputting of light.

Referring to FIG. 1, in the case where the optical output power is to be set to −3.0 dBm, the bias current is set to Ib (room temperature). In the case where the extinction ratio is to be set to 6 dB, the modulation current is set to Ip (room temperature). The Ip (room temperature) is pulse current which alternately varies to the positive and the negative with reference to the Ib (room temperature). In the present specification, the modulation current is represented by a variation width of the pulse. Since a photodiode detects average power of the optical output power of the laser diode, even if the modulation current is input to the laser diode, the optical output power is −3.0 dBm.

In the case where the temperature is comparatively low like a room temperature, the optical output power of the laser diode varies in proportion to driving current within a range within which an oscillation threshold value is exceeded. In this instance, the modulation current can be set using the bias point as a symmetric point. Accordingly, the modulation current can be set using the optical output power detected by a photodiode as a symmetric point.

The gradient of the optical output power with respect to the driving current decreases in response to a rise of the temperature. Consequently, under an environment of a high temperature, in order to implement optical output power (−3.0 dBm) equal to that at the room temperature, it is preferred to set the bias current to Ib (high temperature) higher than Ib (room temperature). Further, in order to implement an extinction ratio (6 dB) equal to that at the room temperature, it is preferred to set the modulation current to Ip (high temperature) higher than Ip (room temperature). In the case where the optical output power varies in proportion to the driving current within a range within which the optical output power exceeds the oscillation threshold value under the high-temperature environment, the modulation current can be set using the bias point as a symmetric point. In other words, the modulation current can be set using the optical output power detected by a photodiode as a symmetric point.

However, under the high-temperature environment, the increasing rate of the optical output power with respect to increase of the driving current sometimes decreases. In other words, a non-linear characteristic sometimes appears between the optical output power and the driving current. In this instance, when a predetermined extinction ratio is to be implemented, the bias point cannot be used as the symmetric point.

Figure 2:
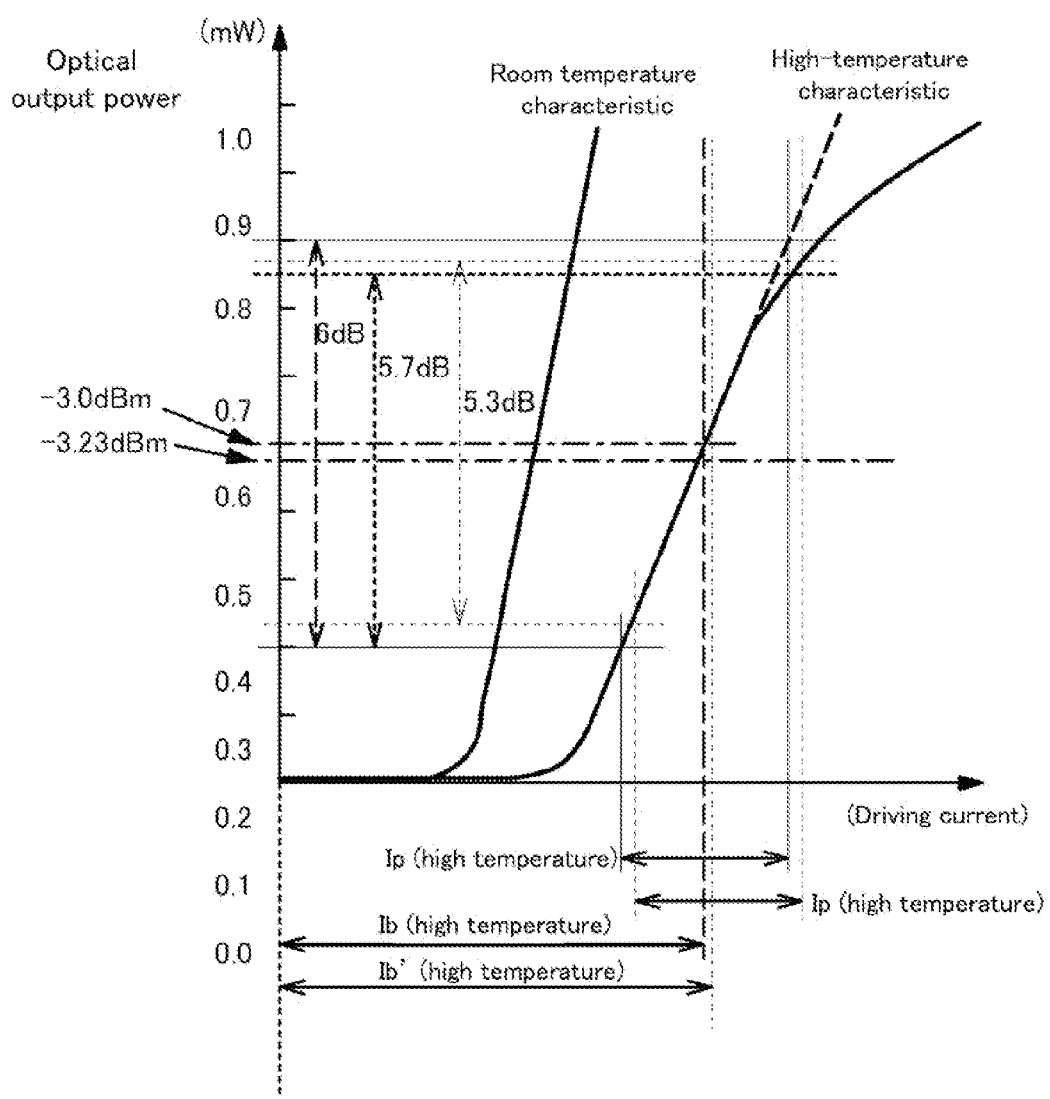

In particular, referring to FIG. 2, in the case where the bias current is set to Ib (high temperature) and the modulation current is set to Ip (high temperature), the optical output power on the high-current side of the modulation current decreases arising from a non-linear characteristic. In this instance, the extinction ratio drops. In FIG. 2, the extinction ratio is approximately 5.7 dB (<6.0 dB). Since the optical power detected by the photodiode is average power, also the optical output power detected by the photodiode decreases.

In FIG. 2, the detected optical output power is −3.23 dBm. Where the APC control is carried out, since the bias current is controlled to current for implementing the optical output power of −3.0 dBm, the bias current increases. In FIG. 2, the bias current is represented by Ib' (high temperature). In this instance, since the optical output power further decreases on the high-current side of the Ip (high temperature) in comparison with a case in which a linear characteristic is obtained, the extinction ratio further drops. In FIG. 2, the extinction ratio drops down to approximately 5.3 dB.

From the foregoing, in the case where a non-linear characteristic appears between the optical output power and the driving current, if popular APC control is carried out, then a desired extinction ratio cannot be obtained. In the following description of an embodiment of the present invention, an optical transmission module and a controlling method for the optical transmission module which can suppress an error from desired values of the optical output power and the extinction ratio even if a non-linear characteristic appears are described.

First Embodiment

Figure 3:
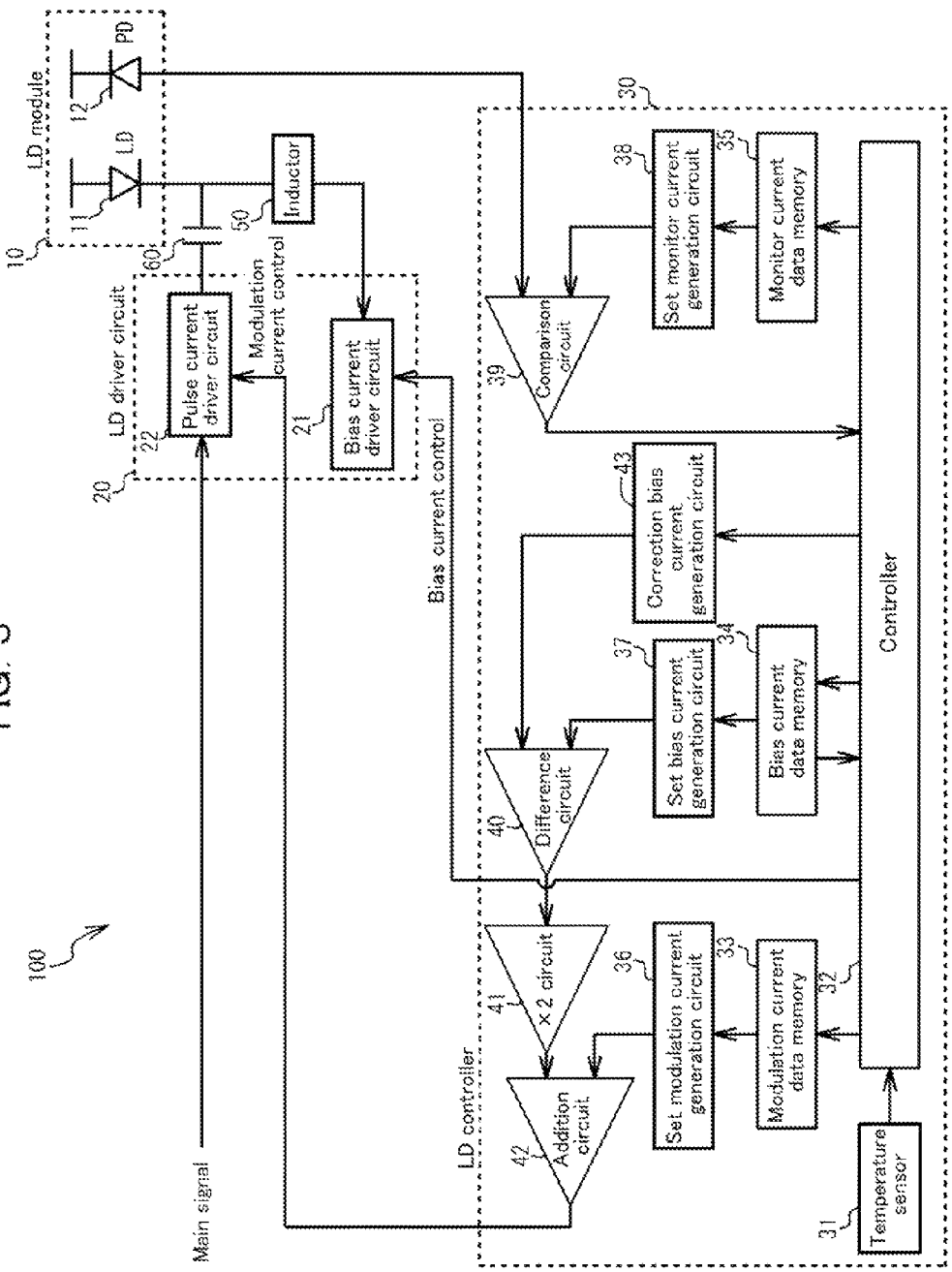
FIG. 3 is a block diagram illustrating a general configuration of an optical transmission module according to a first embodiment of the present invention.

FIG. 3 is a block diagram illustrating a general configuration of an optical transmission module 100 according to a first embodiment of the present invention. Referring to FIG. 3, the optical transmission module 100 includes a Laser Diode (LD) module 10, an LD driver circuit 20 and an LD controller 30.

The LD module 10 includes a laser diode 11 and a photodiode (light reception device) 12. The LD driver circuit 20 includes a bias current driver circuit 21 and a pulse current driver circuit 22. The LD controller 30 includes a temperature sensor 31, a controller 32, data memories, current generation circuits and arithmetic circuits. The data memories include a modulation current data memory 33, a bias current data memory 34 and a monitor current data memory 35. The current generation circuits include a set modulation current generation circuit 36, a set bias current generation circuit 37, a set monitor current generation circuit 38 and a correction bias current generation circuit 43. The arithmetic circuits include a comparison circuit 39, a difference circuit 40, a multiplication circuit 41 and an addition circuit 42. For example, the controller 32 may be a circuit configured from at least one of a processor and a memory for storing a program for controlling the processor, a Field Programmable Gate Array (FPGA) and an Integrated Circuit (IC).

FIG. 4 is a view illustrating an example of attached data tables stored in the data memories. Referring to FIG. 4, set modulation current Ip(s), set bias current Ib(s) and set monitor current Im(s) are stored corresponding to different temperatures in the attached data tables. The set currents can be measured in advance upon a delivery inspection or the like. The set modulation current Ip(s) is stored in the modulation current data memory 33. The set bias current Ib(s) is stored in the bias current data memory 34. The set monitor current Im(s) is stored in the monitor current data memory 35. It is to be noted that the data may be stored not as tables but as temperature functions.

In the following, operation of the optical transmission module 100 is described with reference to FIGS. 3 to 5. The temperature sensor 31 converts the temperature of the laser diode 11 into an electric signal and inputs the electric signal to the controller 32. The controller 32 detects the temperature of the laser diode 11 based on the electric signal input from the temperature sensor 31. The controller 32 acquires a value of the set bias current Ib(s) corresponding to the detected temperature from the bias current data memory 34 and inputs the acquired value to the bias current driver circuit 21. The bias current driver circuit 21 inputs current (set bias current Ib(s)) of the valued supplied from the controller 32 to the laser diode 11. The laser diode 11 outputs light with optical output power at the bias point determined by the set bias current Ib(s).

Further, the controller 32 controls the bias current data memory 34 to output a value of the set bias current Ib(s) corresponding to the detected temperature to the set bias current generation circuit 37. The set bias current generation circuit 37 generates current (set bias current Ib(s)) of the value supplied from the bias current data memory 34 and inputs the generated current to the difference circuit 40.

Further, the controller 32 controls the modulation current data memory 33 to output a value of the set modulation current Ip(s) corresponding to the detected temperature to the set modulation current generation circuit 36. The set modulation current generation circuit 36 generates current (set modulation current Ip(s)) of the value supplied from the modulation current data memory 33 and inputs the generated current to the addition circuit 42. Since the difference circuit 40 and the multiplication circuit 41 do not output signals in an initial state thereof, the addition circuit 42 inputs the set modulation current Ip(s) to the pulse current driver circuit 22. The pulse current driver circuit 22 inputs pulse current corresponding to the input main signal to the laser diode 11 with the modulation width of the set modulation current Ip(s). The laser diode 11 modulates output light in accordance with an extinction ratio at the modulation amplitude which depends upon the set modulation current Ip(s).

The photodiode 12 receives the output light from the laser diode 11. The photodiode 12 converts reception light power into a current signal by photoelectric conversion and inputs the current signal to the comparison circuit 39. It is to be noted that an inductor 50 is interposed between the bias current driver circuit 21 and the laser diode 11. Consequently, inputting of an alternating current signal from the bias current driver circuit 21 to the laser diode 11 is prevented. Further, a capacitor 60 is disposed between the pulse current driver circuit 22 and the laser diode 11. Consequently, inputting of a direct current signal from the pulse current driver circuit 22 to the laser diode 11 is prevented.

Further, the controller 32 controls the monitor current data memory 35 to output a value of set monitor current Im(s) corresponding to the detected temperature to the set monitor current generation circuit 38. The set monitor current generation circuit 38 generates current (set monitor current Im(s)) of the value supplied from the monitor current data memory 35 and inputs the generated current to the comparison circuit 39. The comparison circuit 39 inputs a result of comparison between the monitor current Im(m) input from the photodiode 12 and the set monitor current Im(s) input from the set monitor current generation circuit 38 to the controller 32.

The controller 32 detects a difference (error) of the monitor current Im(m) from the set monitor current Im(s). The set monitor current Im(s) is current corresponding to a target value of the optical output power of the laser diode 11 at the set bias current Ib(s) and the set modulation current Ip(s). Accordingly, if the error is great, then it can be decided that a non-linear characteristic described with reference to FIG. 2 appears. For example, it can be decided using a difference between the set monitor current Im(s) and the monitor current Im(m), a ratio between the currents or the like whether or not a non-linear characteristic appears.

In the case where the error is great, the controller 32 calculates a value of bias current (correction bias current Ib(c)) with which the difference between the set monitor current Im(s) and the monitor current Im(m) decreases and inputs the calculated value to the correction bias current generation circuit 43. In this instance, when the value of the correction bias current Ib(c) is calculated, the controller 32 refers to the bias current data memory 34. Preferably, the controller 32 calculates a value of correction bias current Ib(c) with which the set monitor current Im(s) and the monitor current Im(m) are equalized. The correction bias current generation circuit 43 generates and inputs the correction bias current Ib(c) to the difference circuit 40. The difference circuit 40 calculates a difference ΔI between the set bias current Ib(s) supplied from the set bias current generation circuit 37 and the correction bias current Ib(c) supplied from the correction bias current generation circuit 43.

Here, as described above with reference to FIGS. 1 and 2, if a non-linear characteristic does not appear, then the value of the difference ΔI becomes zero or a value proximate to zero. On the other hand, if a non-linear characteristic appears, then the difference ΔI becomes great. If the modulation current is not corrected in the case where a non-linear characteristic appears, then the extinction ratio drops. Therefore, the extinction ratio is increased in response to the difference ΔI. As an example, the multiplication circuit 41 of FIG. 3 is used. The multiplication circuit 41 inputs correction current obtained by multiplying the difference ΔI by x to the addition circuit 42. It is to be noted that "x" may be any real number only if it is higher than zero, and, for example, "x" is "2".

The addition circuit 42 adds the set modulation current Ip(s) supplied from the set modulation current generation circuit 36 and the correction current input from the multiplication circuit 41 and inputs resulting current to the pulse current driver circuit 22. The pulse current driver circuit 22 determines the current obtained by adding the correction current to the set modulation current Ip(s) as correction modulation current Ip(s') and inputs pulse current having a variation width of the correction modulation current Ip(s') to the laser diode 11.

Figure 5:
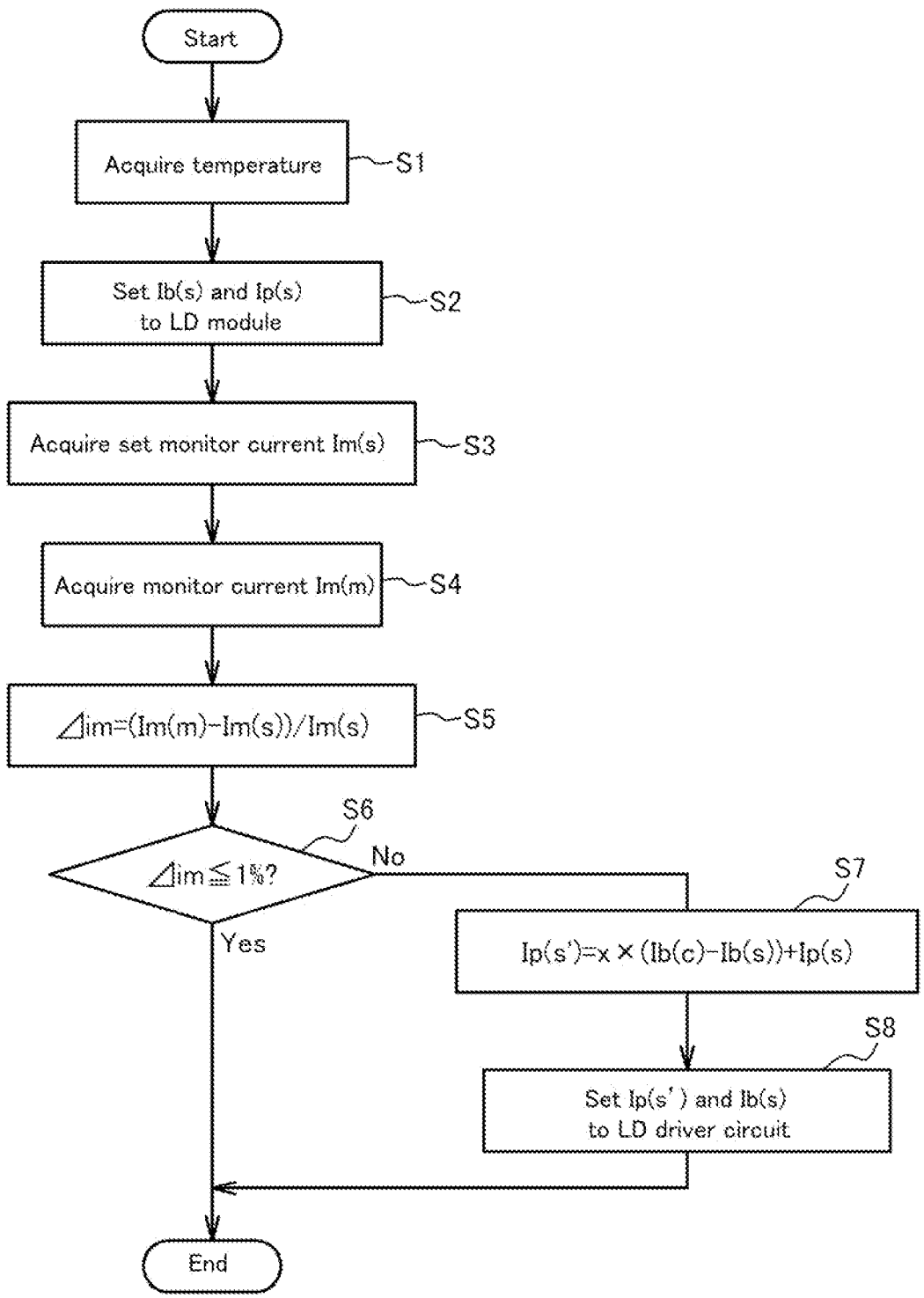
FIG. 5 is a flow chart illustrating an example of a calculation process of correction modulation current Ip(s')

FIG. 5 illustrates an example of a flow chart representing a calculation process of the correction modulation current Ip(s'). Referring to FIG. 5, the controller 32 acquires a temperature of the laser diode 11 based on a result of detection by the temperature sensor 31 (step S1). Then, the controller 32 acquires a value of the set bias current Ib(s) corresponding to the temperature acquired at step S1 and inputs the acquired value to the bias current driver circuit 21. Further, the controller 32 controls the modulation current data memory 33 to output the value of the set modulation current Ip(s) corresponding to the temperature acquired at step S1. Consequently, set bias current Ib(s) and set modulation current Ip(s) are set in the LD module 10 (step S2).

Then, the controller 32 controls the monitor current data memory 35 to output a value of the set monitor current Im(s) corresponding to the temperature acquired at step S1 (step S3). Consequently, the set monitor current Im(s) is input to the comparison circuit 39. The photodiode 12 acquires monitor current Im(m) (step S4). Consequently, the monitor current Im(s) is input to the comparison circuit 39. Then, the controller 32 receives a result of the comparison by the comparison circuit 39 and calculates a difference proportion Δim in accordance with the following expression (1) (step S5). By calculating the difference proportion Δim, an error of the monitor current Im(m) from the set monitor current Im(s) can be calculated.

$$\Delta im = (Im(m) - Im(s))/Im(s) \qquad (1)$$

Then, the controller 32 decides whether or not the difference proportion Δim is within an error range (step S6). In an example of FIG. 5, it is decided whether or not the difference proportion Δim is 1% or less. If a decision result of "Yes" is obtained at step S6, then the modulation current is not corrected. Consequently, unnecessary correction control can be suppressed.

If a decision result of "No" is obtained at step S6, then the controller 32 calculates correction bias current Ib(c) such that the difference between the set monitor current Im(s) and the monitor current Im(m) decreases and inputs the correction bias current Ib(c) to the correction bias current generation circuit 43. Consequently, the addition circuit 42 outputs the correction modulation current Ip(s') as represented by the following expression (2). It is to be noted that "x" is a real number higher than 0.

$$Ip(s') = x \cdot (Ib(c) - Ib(s)) + Ip(s) \qquad (2)$$

Then, by the bias current driver circuit 21, the set bias current Ib(s) is input to the laser diode 11 and the correction modulation current Ip(s') is input to the pulse current driver circuit 22. Consequently, the bias point of the laser diode 11 is set to the set bias current Ib(s) and the modulation width is set to the correction modulation current Ip(s') (step S8). Thereafter, the execution of the flow chart is ended.

With the present embodiment, it can be decided by calculating the difference between the set monitor current Im(s) and the monitor current Im(m) whether or not a non-linear characteristic appears. In other words, it can be decided by calculating the difference ΔI between the set bias current Ib(s) and the correction bias current Ib(c) whether or not a non-linear characteristic appears. Further, the modulation current can be corrected in response to one of the differences described above. In particular, the modulation current is increased in the case where a non-linear characteristic appears. Consequently, drop of the extinction ratio can be suppressed. From the forgoing, errors of the optical output power of the laser diode and the extinction ratio from respective desired values can be suppressed.

Second Embodiment

Figure 6:
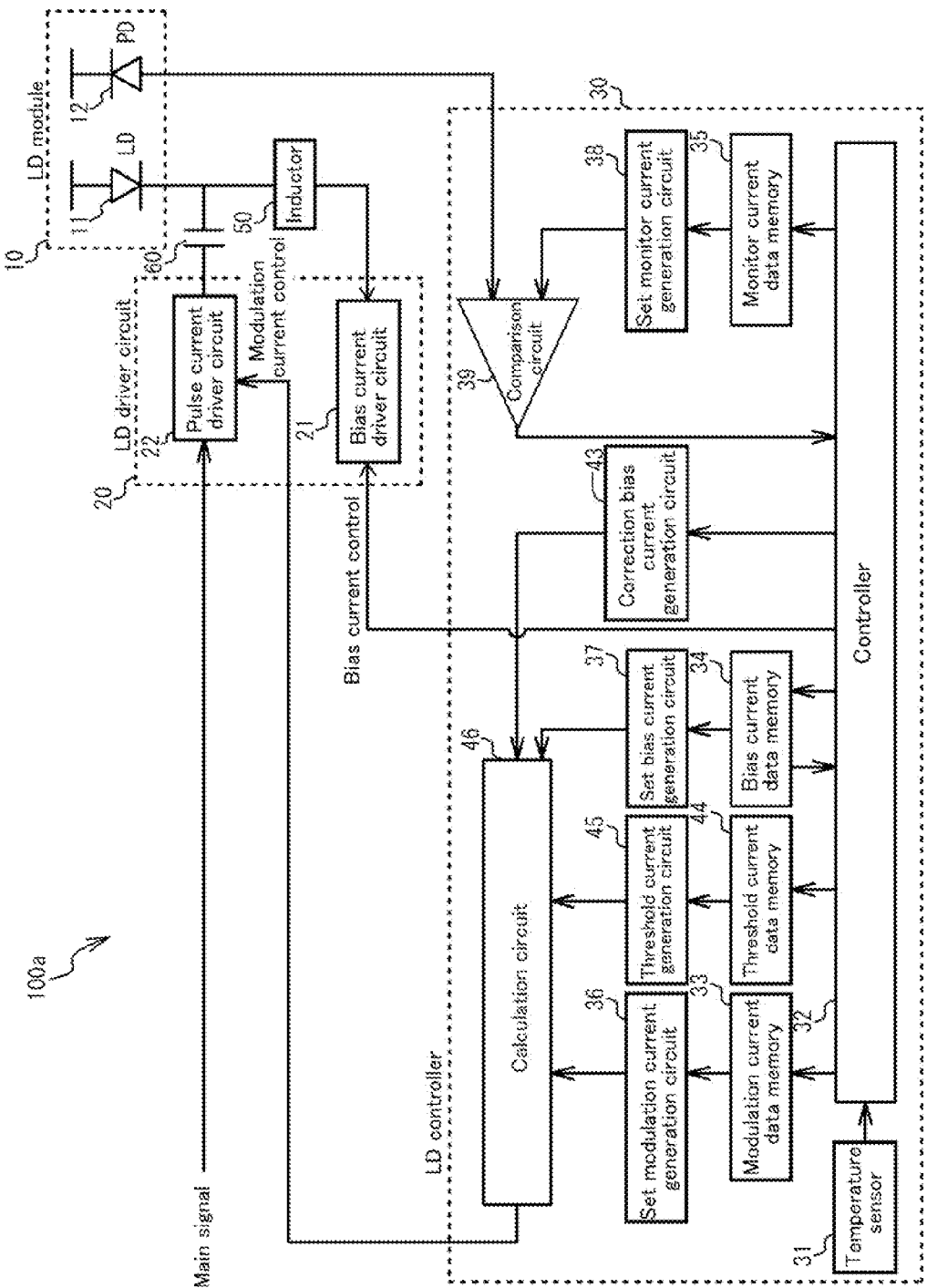
FIG. 6 is a block diagram illustrating a general configuration of an optical transmission module according to a second embodiment of the present invention.

FIG. 6 is a block diagram illustrating a general configuration of an optical transmission module 100a according to a second embodiment of the present invention. In the optical transmission module 100a, different from the optical transmission module 100 in FIG. 3, a threshold current data memory 44 and a threshold current generation circuit 45 are provided. Further, in the optical transmission module 100a, a calculation circuit 46 is provided in place of the difference circuit 40, multiplication circuit 41 and addition circuit 42.

Figure 8:
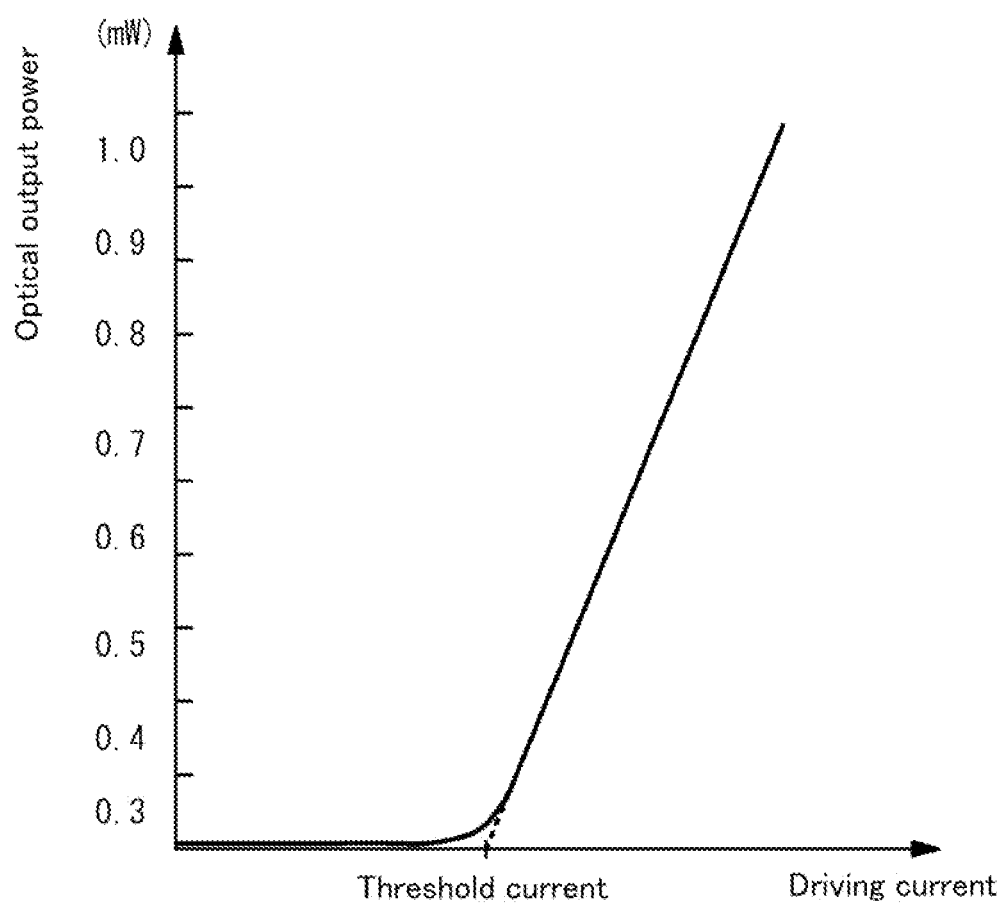
FIG. 8 is a view illustrating threshold current.

FIG. 7 illustrates an example of attached data tables stored in data memories of the optical transmission module 100a. Referring to FIG. 7, in the attached data tables, set threshold current Ith(s) is stored corresponding to each temperature in addition to set modulation current Ip(s), set bias current Ib(s) and set monitor current Im(s). The set currents can be measured in advance upon a delivery inspection or the like. The set threshold current Ith(s) is stored in the threshold current data memory 44. It is to be noted that threshold current indicates a current value when oscillation by the laser diode 11 is started and is represented by FIG. 8. In particular, the threshold current indicates a current value obtained by extending a proportional relationship between the driving current and the optical output power to low optical output power. It is to be noted that the data may be stored not as tables but as temperature functions.

Operation of the optical transmission module 100a different from that of the optical transmission module 100 is described with reference to FIGS. 6 to 9. The set bias current generation circuit 37 inputs the set bias current Ib(s) to the calculation circuit 46 and the set modulation current generation circuit 36 inputs the set modulation current Ip(s) to the calculation circuit 46. Further, the controller 32 controls the threshold current data memory 44 to output a value of the set threshold current Ith(s) corresponding to the temperature detected by the temperature sensor 31. Consequently, the threshold current generation circuit 45 generates and inputs the set threshold current Ith (s) to the calculation circuit 46.

The controller 32 detects a displacement (error) of the monitor current Im(m) from the set monitor current Im(s), and, if the detected error is great, then the controller 32 decides that a non-linear characteristic appears. In this instance, the controller 32 calculates a value of the correction bias current Ib(c) with which the difference between the set monitor current Im(s) and the monitor current Im(m) decreases and inputs the resulting value to the bias current driver circuit 21. Consequently, the bias current driver circuit 21 inputs current (correction bias current Ib(c)) having the value supplied from the controller 32 to the laser diode 11. The laser diode 11 outputs light with optical output power at the bias point which depends upon the correction bias current Ib(c). It is to be noted that the correction bias current Ib(c) is higher than the set bias current Ib(s).

The calculation circuit 46 calculates correction modulation current Ip(s') for implementing a desired extinction ratio ER. Here, the extinction ratio ER can be represented by the following expressions (3) and (4). In the following expressions (3) and (4), "Ib" represents bias current, "Ith" represents threshold current, and "Ip" represents modulation current.

$$ER=(\Delta Ib+Ip/2)/(\Delta Ib-Ip/2) \quad (3)$$

$$\Delta Ib=Ib-Ith \quad (4)$$

If the expressions (3) and (4) above are converted, then the following expression (5) is obtained. Accordingly, if a desired extinction ratio ER is determined in advance and bias current Ib is determined, then the modulation current Ip can be calculated.

$$Ip=2\cdot(ER-1)/(ER+1)\cdot(Ib-Ith) \quad (5)$$

In the present embodiment, the correction bias current Ib (c) is substituted into "Ib" and the set threshold current Ith (s) is substituted into "Ith". Consequently, correction modulation current Ip(s') is obtained. The calculation circuit 46 inputs the correction modulation current Ip(s') to the pulse current driver circuit 22.

Figure 9:
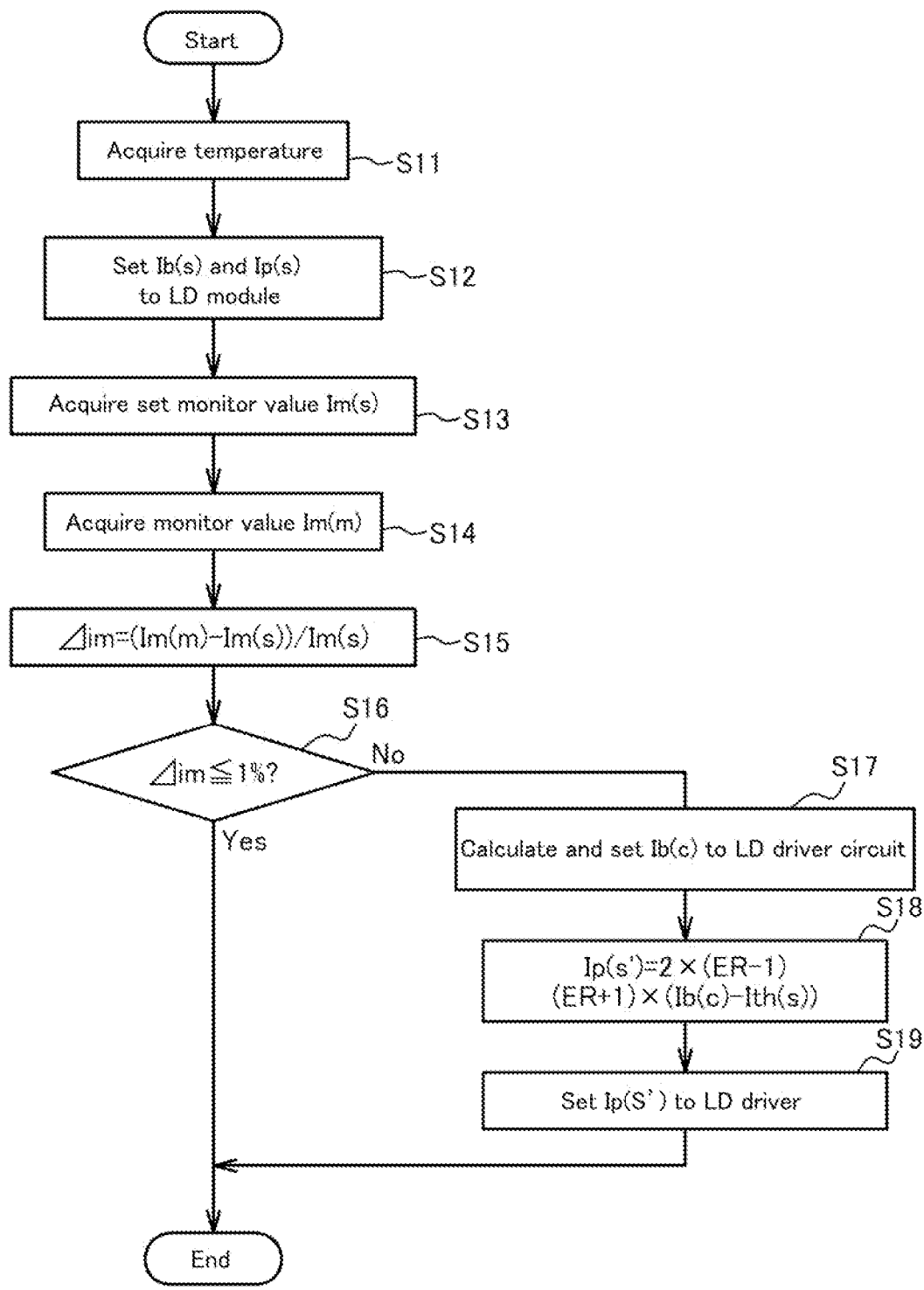
FIG. 9 is a flow chart illustrating an example of a calculation process of correction modulation current Ip(s').

FIG. 9 illustrates an example of a flow chart representative of a calculation process of the correction modulation current Ip(s'). The flow chart of FIG. 9 is different from the flow chart of FIG. 5 in steps S17 and S18. At step S17, the controller 32 calculates the correction bias current Ib(c) such that the difference between the set monitor current Im(s) and the monitor current Im(m) decreases and inputs the correction bias current Ib(c) to the bias current driver circuit 21. Consequently, the laser diode 11 outputs light with optical output power at the bias point which depends upon the correction bias current Ib(c).

Further, the calculation circuit 46 calculates correction modulation current Ip(s') in accordance with the expression (5) (step S18). Consequently, the pulse current driver circuit 22 inputs pulse current corresponding to an input main signal to the laser diode 11 with the modulation width of the correction modulation current Ip (s'). The laser diode 11 modulates output light at the extinction ratio of the modulation amplitude which depends upon the correction modulation current Ip(s').

With the present embodiment, it can be decided by calculating the difference between the set monitor current Im(s) and the monitor current Im(m) whether or not a non-linear characteristic appears. Since the correction bias current Ib(c) is higher than the set bias current Ib(s), the correction modulation current Ip(s') which depends upon the set threshold current Ith(s), extinction ratio ER and correction bias current Ib(c) becomes higher than the set modulation current Ip(s). That is, the modulation signal can be increased in the case where a non-linear characteristic appears. Consequently, drop of the extinction ratio can be suppressed. From the forgoing, errors of the extinction ratio and the optical output power of the laser diode from respective desired values can be suppressed.

It is to be noted that, while, in the embodiments described above, target values of the optical output power and the extinction ratio of the laser diode 11 are fixedly set irrespective of the temperature variation, the present invention is not limited to this. The target values of the optical output power and the extinction ratio of the laser diode 11 may be varied in response to the temperature variation of the laser diode 11. As an example, the optical output power and the extinction ratio of the laser diode 11 may be decreased in the case where the temperature of the laser diode 11 becomes high.

While the embodiments of the present invention have been described in detail, the present invention is not limited to the specific embodiments described hereinabove, and various variations and modifications can be made without departing from the subject matter of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) has (have) been described in detail, it should be understood that the various changes, substitutions, and alterations could be made hereto without departing from the spirit and scope of the invention.

What is claimed is:

1. An optical transmission module, comprising:
    a bias current driver circuit adapted to input bias current set in response to a temperature of a laser diode to the laser diode;
    a modulation current driver circuit adapted to input modulation current set in response to the temperature of the laser diode to the laser diode; and
    a decision circuit adapted to decide whether or not an error of optical output power of the laser diode detected by a light reception device with respect to a target value of the optical output power of the laser diode at the set bias current and the set modulation current is equal to or higher than a threshold value; wherein
    the modulation current driver circuit inputs, while the error is equal to or higher than the threshold value, a correction modulation current higher than the set modulation current to the laser diode;
    the bias current driver circuit inputs a correction bias current for reducing the error to the laser diode; and
    the modulation current driver circuit inputs modulation current determined from an oscillation threshold current, a desired extinction ratio and the correction bias current as the correction modulation current to the laser diode, the oscillation threshold current indicates a current when oscillation by the laser diode is started.

2. The optical transmission module as claimed in claim 1, wherein the modulation current driver circuit inputs current obtained by adding correction current obtained by multiplying a current difference between the correction bias current for reducing the error and the set bias current by a positive coefficient to the set modulation current as the correction modulation current to the laser diode.

3. The optical transmission module as claimed in claim 1, wherein the error is a power difference between the optical output power of the laser diode corresponding to the set bias current and the optical output power of the laser diode detected by the light reception device.

4. A controlling method for an optical transmission module, comprising:
    inputting bias current set in response to a temperature of a laser diode to the laser diode;
    inputting modulation current set in response to the temperature of the laser diode to the laser diode;
    deciding whether or not an error of optical output power of the laser diode detected by a light reception device with respect to a target value of the optical output power of the laser diode at the set bias current and the set modulation current is equal to or higher than a threshold value;
    inputting, while the error is equal to or higher than the threshold value, a correction modulation current higher than the set modulation current to the laser diode; and
    inputting a correction bias current for reducing the error to the laser diode; wherein,
    at the inputting of the correction modulation current, modulation current determined from an oscillation threshold current, a desired extinction ratio and the correction bias current is input as the correction modulation current to the laser diode, the oscillation threshold current indicates a current when oscillation by the laser diode is started.

5. The controlling method for an optical transmission module as claimed in claim 4, wherein, at the inputting of the correction modulation current, current obtained by adding correction current obtained by multiplying a current difference between the correction bias current for reducing the error and the set bias current by a positive coefficient to the set modulation current is input as the correction modulation current to the laser diode.

6. The controlling method for an optical transmission module as claimed in claim 4, wherein the error is a power difference between the optical output power of the laser diode corresponding to the set bias current and the optical output power of the laser diode detected by the light reception device.

* * * * *